United States Patent [19]
Wang

[11] Patent Number: 5,957,420
[45] Date of Patent: Sep. 28, 1999

[54] LEG PAD FOR ELECTRIC APPLIANCE

[75] Inventor: Chien-Lung Wang, Nanking, Taiwan

[73] Assignee: Kinpo Electronics, Inc., Taiwan

[21] Appl. No.: 08/985,974

[22] Filed: Dec. 5, 1997

[30] Foreign Application Priority Data

Dec. 12, 1996 [CN] China .................................. 96 2 49310

[51] Int. Cl.$^6$ .................................................. A47B 91/00
[52] U.S. Cl. ...................................... 248/188.8; 248/677
[58] Field of Search ................................ 248/188.1, 677,
248/634, 615, 673, 188.8, 188.9; 267/140,
153, 292

[56] References Cited

U.S. PATENT DOCUMENTS

| | | | |
|---|---|---|---|
| 2,489,696 | 11/1949 | Boyden | 248/615 |
| 2,935,280 | 5/1960 | Symonds | 248/615 |
| 4,763,868 | 8/1988 | Teich | 248/588 |
| 4,846,428 | 7/1989 | Johannes | 248/188.8 |
| 4,923,158 | 5/1990 | Saisho | 248/188.8 |
| 5,094,416 | 3/1992 | Huon | 248/188.8 |
| 5,153,052 | 10/1992 | Tanaka et al. | 428/212 |
| 5,169,115 | 12/1992 | Chung Hsiang | 248/677 |

Primary Examiner—Ramon O. Ramirez
Assistant Examiner—Anita M. King
Attorney, Agent, or Firm—Dougherty & Troxell

[57] ABSTRACT

A leg pad structure for electronic appliance including a lower casing of the electronic appliance, which is formed with at least one escape hole, a pad seat disposed in the escape hole and connected to a lateral side of the escape hole by a concave resilient arm, and a pad body disposed on the pad seat and protruding out of the escape hole. When suffering a force, the resilient arm is resiliently deformed and inwardly retracted and the pad body is resiliently supported as a cantilever so as to effectively absorb shock or swinging due to a non-planar face of the lower casing or a retaining face on which the electronic appliance rests. In the case of a non-planar retaining face or surface of the lower casing, the weight of the calculator itself will make the respective pad bodies at different positions on the bottom side of the lower casing suffer different weights. Therefore, the resilient arms will be correspondingly resiliently deformed by different amounts and the resilient arms at different positions can be inwardly retracted so as to compensate for the non-planar retaining face or surface of the lower casing.

2 Claims, 3 Drawing Sheets

LEG PAD FOR ELECTRIC APPLIANCE

BACKGROUND OF THE INVENTION

The present invention relates to a leg pad structure for an electronic appliance including a lower casing of the electronic appliance, which is formed with at least one escape hole, a pad seat disposed in the escape hole and connected to a lateral side of the escape hole by a concaved resilient arm, and a pad body disposed on the pad seat. When suffering a force, the resilient arm is resiliently deformed and inwardly retracted so as to effectively absorb shocking or swinging due to a non-planar face of the lower casing or a retaining face on which the electronic appliance is rested.

FIG. 1 shows an existing leg pad structure for an electronic appliance (such as a calculator). Multiple annular projections 51 are formed on a bottom side of a lower casing 5 of the electronic appliance. Each annular projection 51 defines a receptacle 52 for receiving a cylindrical pad body 6. The pad body 6 (which is generally made of rubber material) is subject to resilient deformation by pressure for absorbing shock. However, in consideration of cost and due to affection of the existing processing technique, the lower casing 5 of the general calculator can be hardly manufactured with a completely plane face. Also, the retaining surface on which the calculator is rested is often non-planar. Therefore, in use, the calculator is often unstable. FIG. 2 shows an improved leg pad structure in which the pad body 61 received in the receptacle 52 has a projecting support section 611. When suffering pressure, the support section 611 is more resiliently deformed to improve the stability on a non-planar surface of the lower casing 5 or the retaining surface. However, the limited resilient deformation of the support section 611 still can hardly effectively eliminate the problem of the non-planar surface of the lower casing 5 or the retaining surface.

SUMMARY OF THE INVENTION

It is a primary object of the present invention to provide a leg pad structure for electronic appliance including a lower casing of the electronic appliance, which is formed with at least one escape hole, a pad seat disposed in the escape hole and connected to a lateral side of the escape hole by a concave resilient arm, and a pad body disposed on (adhered to) the pad seat and protruding out of the escape hole. When suffering a force, the resilient arm is resiliently deformed and inwardly retracted and the pad body is resiliently supported as a cantilever. In the case of a non-planar retaining face or surface of the lower casing, the weight of the calculator itself will make the respective pad bodies at different positions on the bottom side of the lower casing suffer different weights. Therefore, the resilient arms will be correspondingly resiliently deformed by different amounts and the resilient arms at different positions can be inwardly retracted so as to offset the non-planar retaining face or surface of the lower casing and prevent the electronic appliance from swinging in use.

It is a further object of the present invention to provide the above leg pad structure in which a support post is disposed on back side of the pad seat. A gap is defined between the support post and a stopper face formed by a circuit board inside the electronic appliance or an upper casing thereof. When the resilient arm suffers an excessively great force, the support post abuts against the stopper face so as to prevent the resilient arm from being over-deformed and damaged.

The present invention can be best understood through the following description and accompanying drawings, wherein:

DETAILED DESCRIPTION OF THE PREFERRED EMBODIMENT

Figure 1:
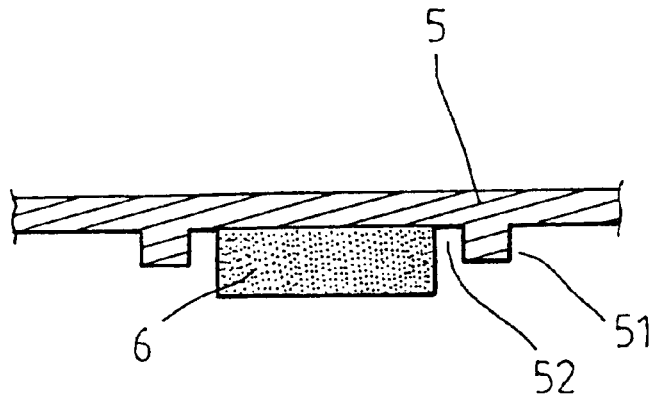
FIGS. 1 and 2 are sectional views showing the conventional leg pad structures for electronic appliance.
Figure 2:
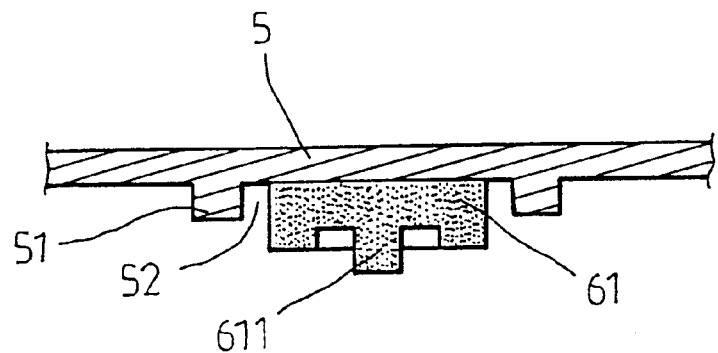
Figure 4:
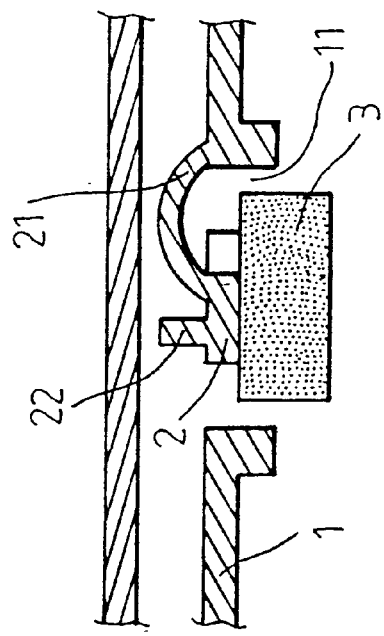
FIG. 4 is a sectional view of the present invention.
Figure 3:
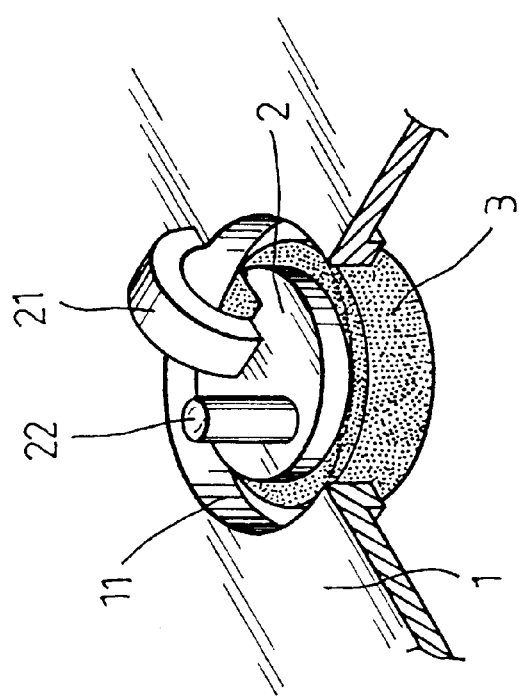
FIG. 3 is a partially sectional perspective view showing the structure of the present invention.
Figure 5:
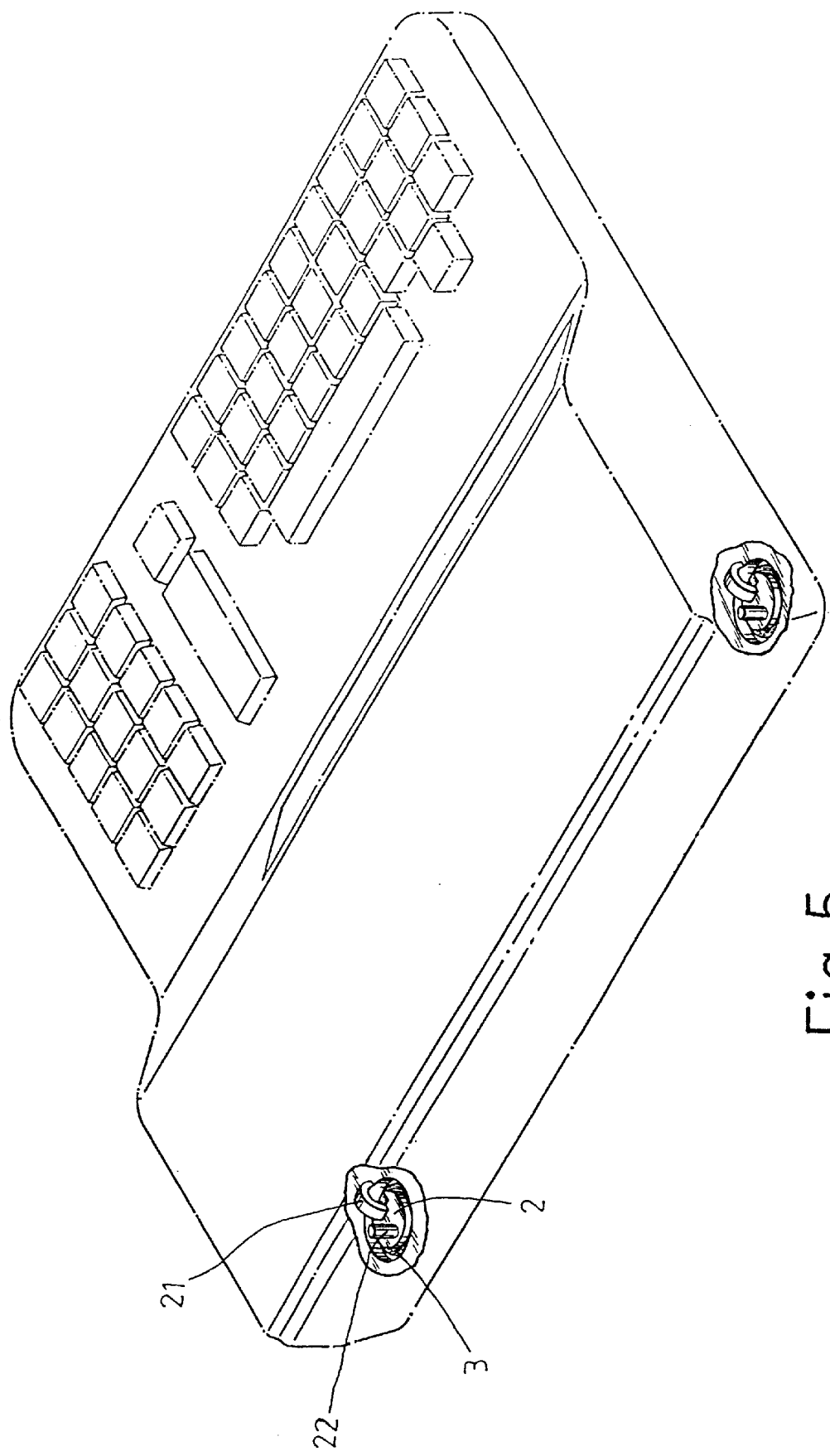
FIG. 5 shows the application of the present invention to a calculator.

Please refer to FIGS. 3 to 5. The present invention includes a lower casing 1, a pad seat 2 and a pad body 3. The bottom face of the lower casing 1 is formed with an escape hole 11. The pad seat 2 is disposed in the escape hole 11 and connected to a lateral side of the escape hole 11 by a concave resilient arm 21 extending therefrom. A support post 22 extends from back side of the pad seat 2 to an inner side of the escape hole 11. The pad body 3 is disposed on (adhered to) the pad seat 2 and protrudes out of the escape hole 11.

When using the electronic appliance, the pad body 3 contacts with the retaining surface, whereby the resilient arm 21 suffers a force and is resiliently inwardly retracted. Therefore, the pad body 3 is resiliently supported as a cantilever so as to effectively absorb shock.

In the case of a non-planar retaining face or surface of the lower casing 1, the weight of the calculator itself will make the respective pad bodies 3 at different positions of the bottom side of the lower casing 1 suffer different weights. Therefore, the resilient arms 21 will be correspondingly resiliently deformed by different amounts. Therefore, the resilient arms 21 at different positions can be inwardly retracted so as to offset the non-planar retaining face or surface of the lower casing 1 and keep the calculator stably rested without swinging.

In the case that the electronic appliance suffers great load or is abnormally used to lead to serious deformation of the resilient arms 21, the support post 22 on the back side of the pad seat 2 can properly abut against a stopper face (which can be a circuit board or an upper casing) inside the calculator so as to bear most of the force from the pad body 3. Therefore, the resilient arms 21 are prevented from being over-deformed and damaged.

It should be noted that the above description and accompanying drawings are only used to illustrate one embodiment of the present invention, not intended to limit the scope thereof. Any modification of the embodiment should fall within the scope of the present invention.

What is claimed is:

1. A leg pad structure in combination with an electronic appliance having a bottom with at least one hole therein, the leg pad structure comprising:

a pad seat disposed in the at least one hole and connected to a lateral side of the hole by a concave resilient arm extending therefrom; and a pad body disposed on the pad seat and protruding out of the at least one hole whereby the pad body is resiliently supported as a cantilever so as to compensate for shocking or swinging due to a non-planar bottom or a non-planar surface on which the electronic appliance rests.

2. The leg pad structure as claimed in claim 1, wherein the pad seat has a first side on which the pad body is disposed, and a second, opposite side, and further comprising a support post disposed on the second side of the pad seat, whereby when the pad seat is moved, the support post prevents the resilient arm from being over-deformed and damaged.

* * * * *